United States Patent
Kubo et al.

(10) Patent No.: US 7,413,954 B2
(45) Date of Patent: Aug. 19, 2008

(54) INSULATED GATE SEMICONDUCTOR DEVICE AND MANUFACTURING METHOD OF THE SAME

(75) Inventors: Hirotoshi Kubo, Ora-gun (JP); Junichiro Tojo, Hashima (JP); Hiroaki Saito, Ota (JP); Masahito Onda, Ora-gun (JP); Satoshi Iwata, Ora-gun (JP); Masamichi Yanagida, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 52 days.

(21) Appl. No.: 11/230,538

(22) Filed: Sep. 21, 2005

(65) Prior Publication Data

US 2006/0065926 A1    Mar. 30, 2006

(30) Foreign Application Priority Data

Sep. 27, 2004    (JP)    ............................ 2004-278866

(51) Int. Cl.
    *H01L 21/336*    (2006.01)
(52) U.S. Cl. ................. 438/270; 438/589; 257/E21.629

(58) Field of Classification Search ................. 438/206, 438/212, 270, 272, 589; 257/E21.419, E21.629
See application file for complete search history.

(56) References Cited

U.S. PATENT DOCUMENTS

| 5,283,201 | A  | * | 2/1994 | Tsang et al. | ................. 438/270 |
| 2004/0166636 | A1 | * | 8/2004 | Darwish | ..................... 438/270 |

FOREIGN PATENT DOCUMENTS

| JP | 1167787 | | 3/1999 |
| JP | 274397 | A | 10/2001 |
| JP | 158268 | A | 5/2003 |

* cited by examiner

*Primary Examiner*—Chandra Chaudhari
(74) *Attorney, Agent, or Firm*—Morrison & Foerster LLP

(57) ABSTRACT

A capacity layer is formed of non-doped polysilicon. Unlike capacity layers formed of an oxide film, generation of seams and the like can be suppressed and thereby a stable capacity layer can be formed. Moreover, polysilicon used as a capacity layer may be doped polysilicon, and an oxide film formed on the surface of the polysilicon also serves as a capacity film. Thus, provision of an insulated gate device featuring low capacity is made possible.

3 Claims, 12 Drawing Sheets

Prior Art

Prior Art

Prior Art

INSULATED GATE SEMICONDUCTOR DEVICE AND MANUFACTURING METHOD OF THE SAME

BACKGROUND OF THE INVENTION

1. Field of the Invention

The present invention relates to an insulated gate semiconductor device and a method of manufacturing the same. More specifically, the present invention relates to an insulated gate semiconductor device with a trench structure for reducing a gate-drain capacity and to a method of manufacturing the same.

2. Description of the Related Art

FIG. 15 is a cross-sectional view of an insulated gate semiconductor device with a conventional trench structure. By way of example, this drawing shows an n-channel type MOSFET.

A channel layer 24 is provided on the surface of a drain region 22 which is provided on a semiconductor substrate 21. Trenches 27 are then formed in such a way that they penetrate through the channel layer 24. The inner walls of the trenches 27 are covered with a gate oxide film 31, and gate electrodes 33 are embedded therein. Source regions 35 and body regions 34 are formed on the surface of the channel layer 24 to form a source electrode 38. This technology is described for instance in Japanese Patent Application Publication No. Hei 11-67787.

Moreover, an approach has been made to form a thick oxide film on the bottom of a trench in order to reduce a capacity in an insulated gate semiconductor device with such a trench structure.

FIG. 16 shows an example of a technology for making the oxide film formed on the bottom of a trench thicker than the oxide film formed on the side walls of the trench.

Nitride films are provided on the inner walls of trenches TR 21 provided in substrates 56 and 57. The nitride film formed on the bottom of each trench is then removed while remaining nitride films NL41 and NL42 formed on the side walls of the trench intact (FIG. 16A). Thereafter, an oxide film OL52 is selectively allowed to grow on the bottom of each trench where the substrate is exposed (FIG. 16B). The nitride films NL41 and NL42 formed on the side walls of each trench are removed, and gate oxide films GL61 and GL62 are then formed on the side walls of each trench (FIG. 16C). This technology is described for instance in Japanese Patent Application Publication No. 2003-158268.

In addition, FIG. 17 shows an example of a technology for forming a thick oxide film on the bottom of a trench by CVD method.

After forming trenches 107 on a substrate 101, the trenches 107 are completely filled with an oxide film by CVD method. A part of the oxide film is then removed by dry etching or wet etching. In this way an embedded oxide film 110 with a thickness of, for example, about 2,000 Å is formed on the bottom of each trench 107. Thereafter, a gate oxide film 111 with a thickness depending on a drive voltage is formed on the inner wall of each trench 107. Thus, the thin gate oxide film 111 is formed on the side walls of each trench 107 to come in contact with a channel layer 104, and the thick, embedded oxide film 110 is formed on the bottom of each trench 107. This technology is described for instance in Japanese Patent Application Publication No. 2001-274397.

In insulated gate semiconductor devices with a trench structure as represented by MOSFETs, extremely thin insulating films are formed on the inner wall of trenches as the capabilities of such devices expand. Meanwhile, an input capacity Ciss, an output capacity Coss and a return capacity Crss are of importance for MOSFETs and, therefore, it is imperative that they are reduced in order to increase device characteristics.

In particular, a gate-drain capacity Cgd is responsible for the input capacity Ciss, the output capacity Coss and the return capacity Crss. In MOSFETs with a trench structure, the gate-drain capacity Cgd is the capacity of the bottom of a trench. For this reason, an approach has been made to form, by means of an enhanced oxidation or a selective oxidation as described above, a thick oxide film only on the bottom of trenches while providing the side walls of the trenches with a thin oxide film.

However, the technology shown in FIG. 16 requires a process for forming nitride films, a process for removing only a nitride film provided on the bottom of trenches, a selective oxidation process, a process for removing a nitride film provided on the side walls of trenches and a processe for forming a gate oxide film. Thus, there have been problems, for example, that the number of processes is increased and the processes become complicated.

Meanwhile, when oxide films are intended to be embedded in trenches by CVD method or the like as shown in FIG. 17, a hollow space called void or seam is likely to be formed in the oxide films embedded in the trenches. The generation of voids and seams is attributed to the formation of growing seeds on the side walls of trenches in a CVD process. In this case, if there is a portion on the side walls where the seeds grow at a higher rate, an oxide film formed at the portion closes the trench and thereby voids are generated in the oxide film below the portion. In addition, even when voids are not generated, seams are likely to be generated because the oxide films growing from the side walls of a trench are connected at the center of the trench. An etchant penetrates the oxide film through voids and seams and causes the occurrence of abnormal formation, causing a problem that devices are not stably formed.

Furthermore, the following method is also known: forming a thick oxide film only on the bottom of a trench by an enhanced oxidation of a semiconductor layer in which an impurity concentration is selectively increased. However, since this method cannot provide an increased amount of oxide films, it is less effective than the methods for embedding insulating films such as oxide films in trenches.

DESCRIPTION OF THE PREFERRED EMBODIMENTS

Embodiments of the present invention will be described in detail with reference to FIGS. 1 to 14 with an n-channel type MOSFET having a trench structure taken as an example.

Figure 1:
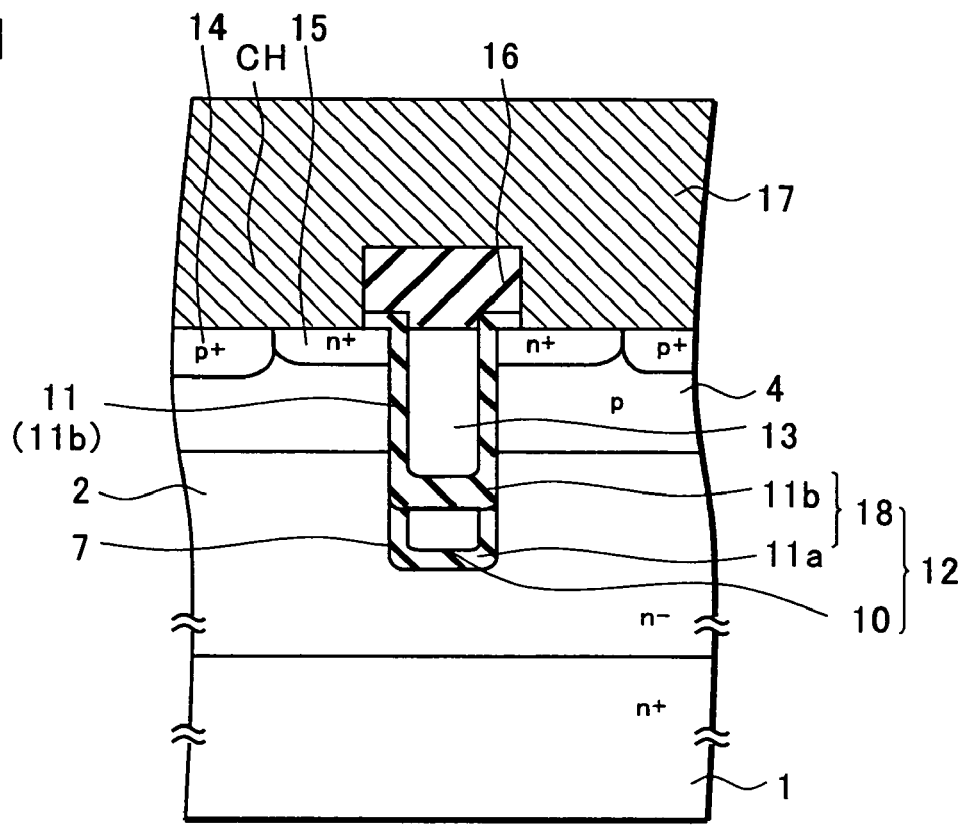
FIG. 1 is a cross-sectional view for explaining an insulated gate semiconductor device of a first embodiment.

FIG. 1 is a cross-sectional view showing a structure of a MOSFET of a first embodiment.

The MOSFET of the first embodiment includes semiconductor substrate 1, semiconductor layer 2, a channel layer 4, a trench 7, a first semiconductor layer 10, a first oxide film 11a, a second oxide film 11b, a second semiconductor layer 13, a source region 15 and a body region 14.

The substrate is provided with a drain region, which is obtained by depositing the $n^-$ semiconductor layer 2 on the $n^+$ silicon semiconductor substrate 1 by epitaxial growth or the like. The p-channel layer 4 is formed on the surface of the $n^-$ semiconductor layer 2.

The trench 7 is provided in a way that it penetrates through the channel layer 4 and reaches the drain region 2. The bottom inside wall (side surfaces and bottom surface) of the trench 7 is covered with the first oxide film 11a, and the first semiconductor layer 10 is embedded therein. In addition, the surface of the first semiconductor layer 10 and the side walls of the trench 7 are covered with the second oxide film 11b.

The first semiconductor layer 10 is non-doped polysilicon, the outside of which is surrounded by a part of the second oxide film 11b provided on the surface thereof and by the first oxide film 11a, and constitutes a capacity layer 12. Note that, hereinafter, the first and second oxide films covering the first semiconductor layer 10 in the capacity layer 12 are collectively referred to as a bottom-oxide film 18.

The first semiconductor layer 10 is embedded in the bottom of the trench 7 provided below the channel layer 4 and has a thickness of, for example, 1,000 to 3,000 Å. The provision of the thick capacity layer 12 in the bottom of the trench 7 in this way significantly reduces the gate-drain capacity Cgd of the MOSFET.

A part of the second oxide film 11b is provided on the side walls of the trench 7 that are at least adjacent to the channel layer 4 in a thickness of several hundreds Å, thereby constituting a gate oxide film 11.

The second semiconductor layer 13 is provided above the first semiconductor layer 10, with the bottom-oxide film 18 (a part of the second oxide film 11b) interposed therebetween. The second semiconductor layer is obtained by filling polysilicon doped with impurities into the trench 7, constituting a gate electrode 13.

The $n^+$ source region 15 is provided on the surface of the channel layer 4 so as to be adjacent to the trench 7. The $p^+$ body region 14 is provided on the surface of the channel layer 4 between adjacent the source regions 15. Thus, when a voltage is applied to the gate electrode 13, a channel region (not shown) is formed along the trench 7 from the source region 15. The top of the gate electrode 13 is covered with an interlayer insulating film 16. Each portion between adjacent interlayer insulating films 16 constitutes a contact hole CH that contacts with a metal wiring layer (a source electrode) 17. The metal wiring layer 17 made of aluminum alloy or the like is electrically connected to the source region 15 and the body region 14 which are exposed out of the contact hole CH, with a barrier metal layer (not shown) interposed therebetween.

By way of example, a description will be provided for a case where the gate oxide film has a thickness of, for example, about 700 Å. When the capacity layer 12 is not intended to be provided, i.e., when only the gate oxide film 31 is intended to be provided on the bottom of trenches (see FIG. 15), the gate-drain capacity Cgd' is about 300 pF. However, the gate-drain capacity Cgd can be reduced to one-third, that is, about 100 pF, by embedding the first semiconductor layer 10 in a thickness of, for example, about 2,000 Å and by covering it with the bottom-oxide film 18 to constitute the capacity layer 12.

Although mentioned later, in the first embodiment the first oxide film 11a is also formed on the side walls of the each trench 7 and after the first oxide film 11a is removed, the second oxide film 11b is formed thereon. Since polysilicon features a high etching selectivity to oxide films, the side walls of each trench 7 are less likely to be damaged at the time when an etching process is performed for embedding the first semiconductor layer 10 only into the bottom of each trench 7. However, by removing the first oxide film 11a formed on the side walls of each trench 7 and newly forming the second oxide film 11b thereon, a thin, damage-free gate oxide film 11 can be formed on the side walls of each trench 7, thereby achieving a stable oxide film formation.

In addition, oxide films made of polycrystalline silicon grow faster than those made of monocrystalline silicon. For this reason, with respect to the second oxide film 11b, the oxide film constituting the bottom-oxide film 18 is thicker than the oxide film, which is formed on the side walls and constituting the gate oxide film 11. In this way a further reduction in the capacity can be achieved.

Figure 2:
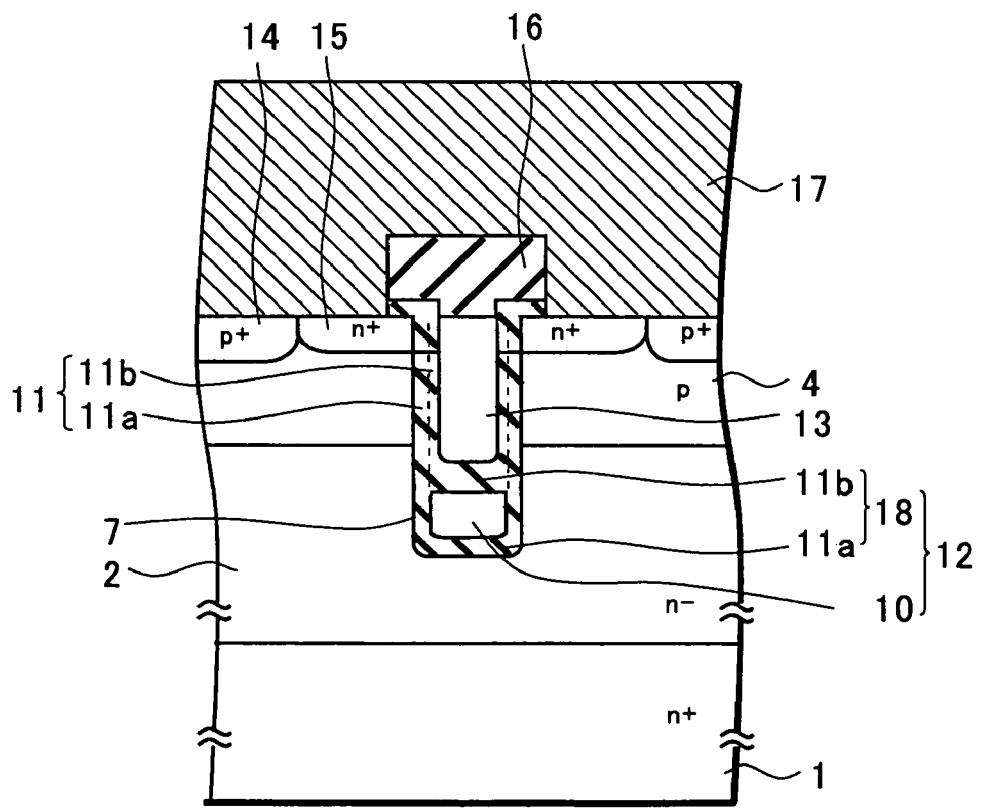
FIG. 2 is a cross-sectional view for explaining the insulated gate semiconductor device of a second embodiment.
Figure 3:
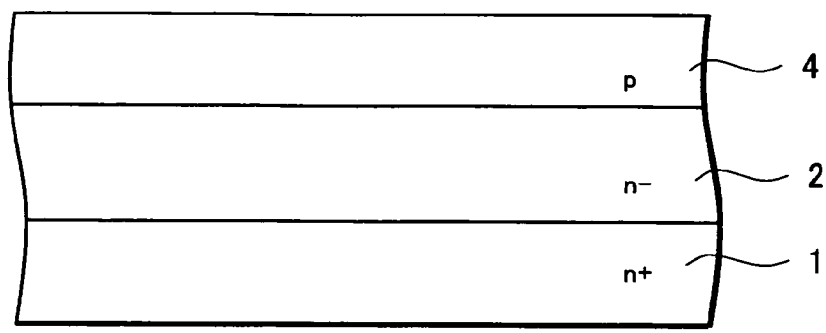
FIG. 3 is a cross-sectional view for explaining the method of manufacturing the insulated gate semiconductor device of the first embodiment.

FIG. 2 shows a second embodiment of the present invention.

In the second embodiment, a first oxide film 11a and a second oxide film 11b are formed on the side walls of a trench 7 that are adjacent to a channel layer 4.

A first semiconductor layer 10 is non-doped polysilicon embedded in the bottom of the trench 7 provided below the channel layer 4, and has a thickness of, for example, 1,000 to 3,000 Å. The first semiconductor layer 10 is surrounded by a bottom-oxide film 18, which is formed of a part of the second oxide film 11b provided on the surface thereof and the first oxide film 11a provided on the bottom and side walls of the trench 7, and constitutes a capacity layer 12.

The first oxide film 11a covering the outside of the first semiconductor layer 10 is also formed on the side walls of the trench 7 that are adjacent to the channel layer 4. Moreover, the second oxide film 11b is provided on the first oxide film 11a formed on the side walls of the trench 7. These oxide films constitute a gate oxide film 11.

The second oxide film 11b is also provided on the side walls of the trench 7 and continues to the surface of the first semiconductor layer 10, thereby constituting a part of the bottom-oxide film 18.

Since other components are similar to those in the first embodiment, descriptions thereof will be omitted.

Although mentioned later, in the second embodiment the second oxide film 11b is formed with the first oxide film 11a formed on the side walls of the trench 7 remained intact. Thus, the gate oxide film 11 has a two-layer structure of the first oxide film 11a and the second oxide film 11b.

However, for example, when the first oxide film 11a and the second oxide film 11b are formed under the same condition in this drawing, the second oxide film 11b formed on the first oxide film 11a grows slow, i.e., the thickness of the gate oxide film 11 is twice or less that of the first oxide film 11a.

Accordingly, the capacity layer 12 can be formed by suppressing the increase of the thickness of the gate oxide film 11 formed on the side walls of the trench 7.

Next, the method of manufacturing the insulated gate semiconductor device according to embodiments of the present invention will be described with reference to FIGS. 3 to 14.

The method of manufacturing the insulated gate semiconductor device includes the steps of: preparing a substrate by depositing a semiconductor layer 2 on a semiconductor substrate 1; forming a trench that penetrates through the channel layer and reaches the semiconductor substrate; forming an insulating film at least on the inner wall of the trench; embedding a first semiconductor layer in the bottom of the trench; forming a second semiconductor layer to be embedded in the trench and located on the first semiconductor layer; and forming a source region of one conduction type on the surface of the channel layer so as to be adjacent to the trench.

FIGS. 3 to 10 show the manufacturing method in the first embodiment.

First process (FIG. 3): a process for preparing the substrate by depositing the semiconductor layer 2 on the semiconductor substrate 1.

The substrate is provided with the drain region, which is obtained by depositing the n⁻ semiconductor layer 2 on the n⁺ silicon semiconductor substrate 1 by epitaxial growth or the like.

A mask formed of an oxide film (not shown) is provided on the drain region 2. P-type impurity, such as boron ions, are then implanted on the entire surface of the substrate at an implantation energy of 50 keV and at a dose amount of 1E13 to 3E13 cm$^{-2}$, followed by a heat treatment at around 1,100° C. Thereby, boron ions are diffused and a channel layer 4 is formed.

Second process (FIGS. 4A and 4B): formation of trench that penetrate through the channel layer and reach the semiconductor layer.

Figure 4A:
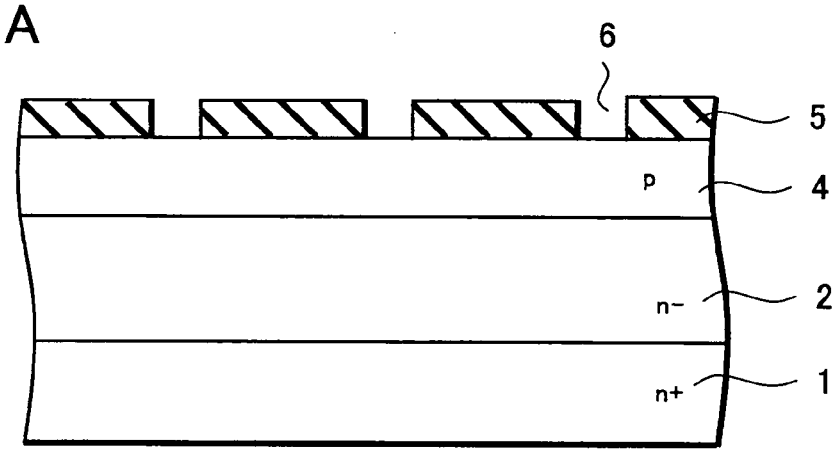
FIG. 4A is a cross-sectional view for explaining the method of manufacturing the insulated gate semiconductor device of the first embodiment.

A CVD oxide film 5 made of non-doped silicate glass (NSG) is formed on the entire surface of the substrate 4 by CVD method. Thereafter, a mask formed of a resist film is placed onto the CVD oxide film 5 except for region where the trench is to be opened. The CVD oxide film 5 is partially removed by dry etching to form trench opening 6 where the channel region 4 is exposed. The resist film is then removed (FIG. 4A).

Figure 4B:
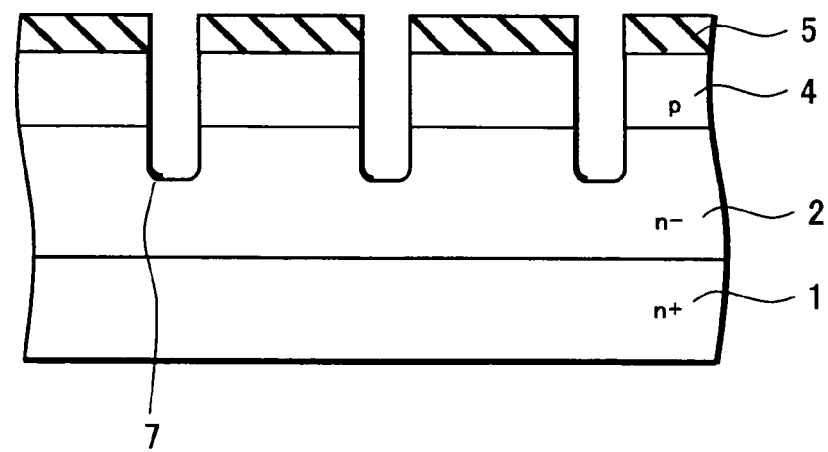
FIG. 4B is a cross-sectional view for explaining the method of manufacturing the insulated gate semiconductor device of the first embodiment.
Figure 5:
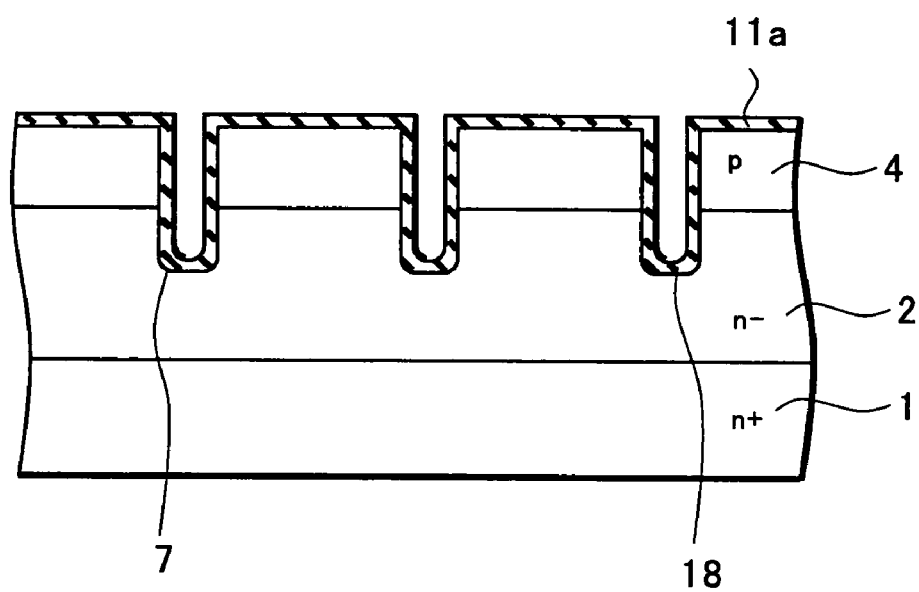
FIG. 5 is a cross-sectional view for explaining the method of manufacturing the insulated gate semiconductor device of the first embodiment.

Subsequently, using the CVD oxide film 5 as a mask, portions of the substrate that correspond to the trench opening 6 is dry-etched by CF gas and HBr gas, thereby forming trench 7 that penetrate through the channel layer 4 and reach the drain region 2 (FIG. 4B).

An oxide film (not shown) is formed on the inner wall of each of the trench 7 and on the surface of the channel layer 4 by a dummy oxidation and thereby the etching damage of the dry etching is removed. The oxide film and the CVD oxide film 5 are then removed by etching.

Third process (FIG. 5): a process for forming a first insulating film on the inner wall of a trench.

The entire surface of the substrate is thermally oxidized to form a first oxide film 11a on the inner wall of each of the trench 7 in a thickness of, for example, about 300 to 700 Å. The first oxide film 11a formed on the bottom of each of the trench 7 constitutes a part of a bottom-oxide film 18.

Forth process (FIGS. 6A and 6B): a process for embedding a first semiconductor layer in the bottom of a trench.

Figure 6A:
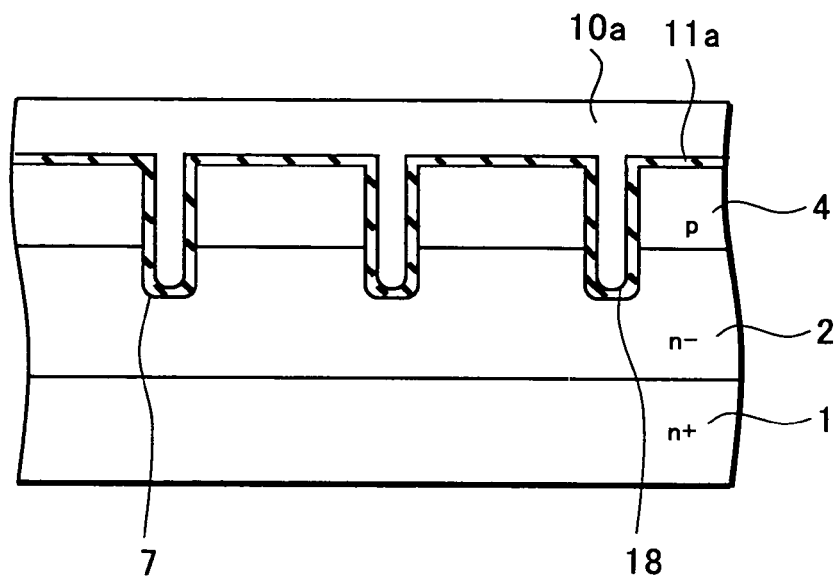
FIG. 6A is a cross-sectional view for explaining the method of manufacturing the insulated gate semiconductor device of the first embodiment.
Figure 6B:
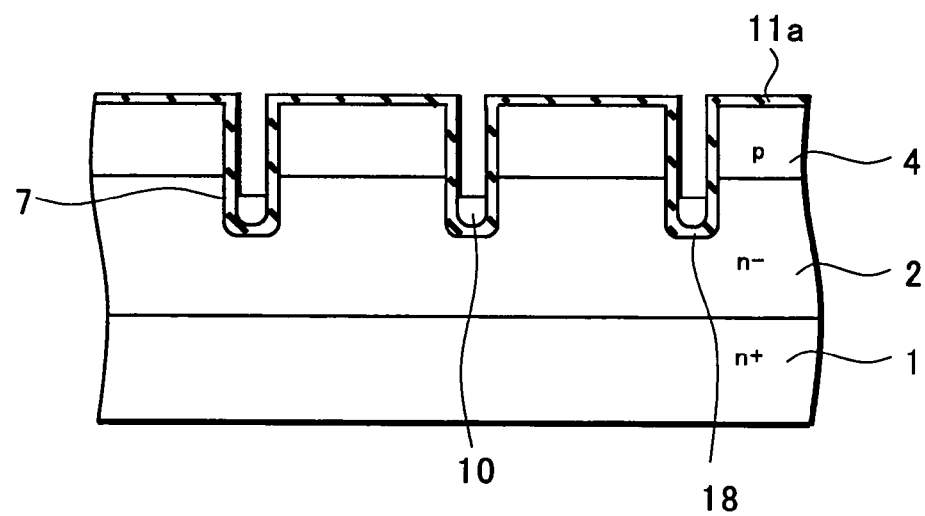
FIG. 6B is a cross-sectional view for explaining the method of manufacturing the insulated gate semiconductor device of the first embodiment.

A non-doped polysilicon 10a is deposited on the entire surface of the substrate, filling the trench 7 (FIG. 6A). The entire surface of the substrate is etched back and thereby a first semiconductor layer 10 is formed that is embedded in the bottom of each of the trench 7 provided below the channel layer 4. The first semiconductor layer 10 has a thickness of 1,000 to 3,000 Å (FIG. 6B). The first semiconductor layer 10 constitutes a capacity layer. To be more specific, the capacity layer is formed as a result of deposition of polysilicon in this embodiment. For this reason, unlike the case where CVD method is used to embed an oxide film in trenches, seams never be generated, leading to elimination of the occurrence of abnormal etching that is caused by such seams. Thus, stable capacity layer formation can be achieved.

Fifth process (FIGS. 7A and 7B): a process for forming a second insulating film on the inner wall of a trench.

Figure 7A:
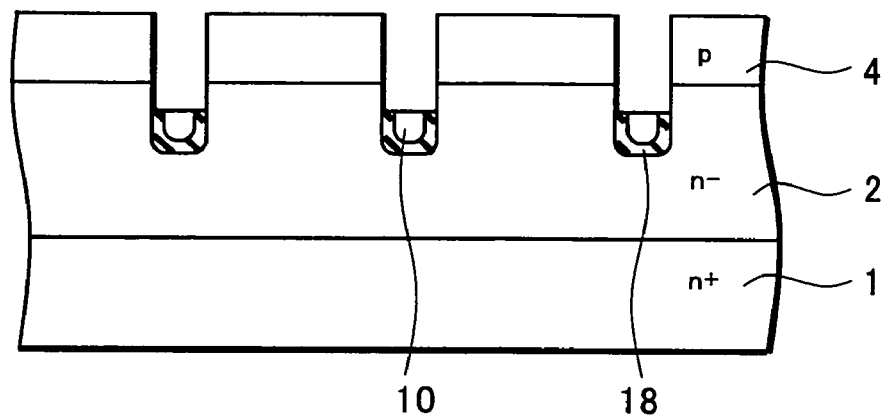
FIG. 7A is a cross-sectional view for explaining the method of manufacturing the insulated gate semiconductor device of the first embodiment.

The first oxide film 11a is slightly damaged by the etching of the polysilicon 10a in the forth process. Therefore, the first oxide film 11a formed on the side walls of each of the trench 7 is removed by etching (FIG. 7A). At this point, a wet etching is employed by use of an etchant such as hydrofluoric acid. As described above, an oxide film has a high etching selectivity to polysilicon. For this reason, the first oxide film 11a exposed above the first semiconductor layer 10 can be removed, and additionally, the side walls of each of the trench 7 never be damaged.

The first insulating film 11a is a thin film with a thickness of 1,000 Å or less (e.g., about 300 to 700 Å). Accordingly, an etching operation for the side walls of each of the trench 7 finishes before an etchant penetrates through the first insulating film 11a surrounding the semiconductor layer 10. In other words, the first oxide film 11a surrounding the first semiconductor layer 10 is hardly influenced by the etching.

To be more specific, as shown in FIG. 7A, the first oxide film 11a above the first semiconductor layer 10 is removed by etching.

Figure 7B:
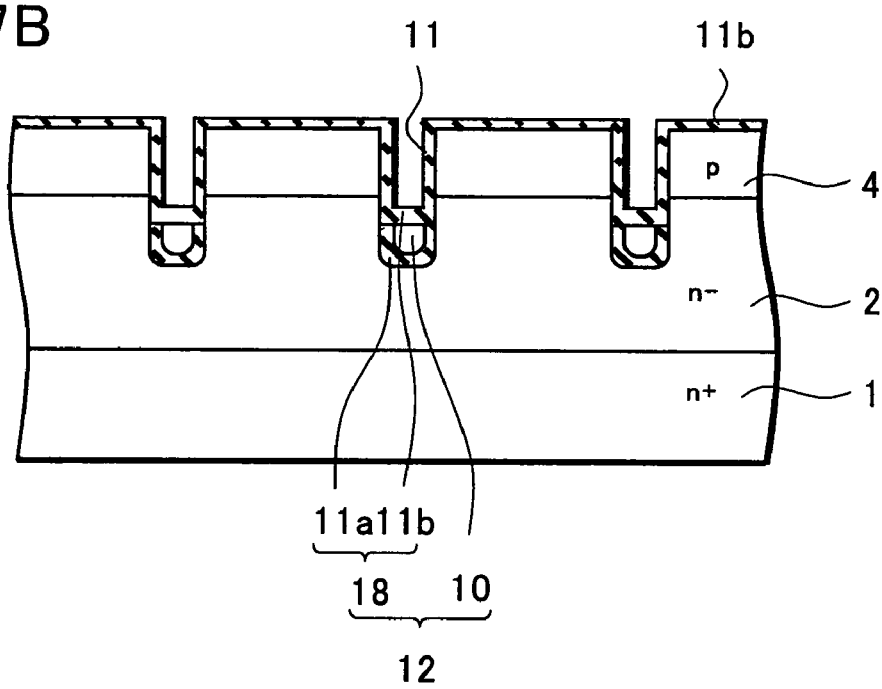
FIG. 7B is a cross-sectional view for explaining the method of manufacturing the insulated gate semiconductor device of the first embodiment.

Subsequently, the entire surface of the substrate is thermally oxidized again to form a second oxide film 11b on the inner wall of each of the trench 7 in a thickness of, for example, about 300 to 700 Å, depending on a drive voltage. The second oxide film 11b formed on the side walls of each of the trench 7 that are adjacent to the channel layer 4 constitutes the gate oxide film 11. In addition, the second oxide film 11b is also provided on the surface of the first semiconductor layer 10 and, together with the first oxide film 11a on the bottom of the trench 7, constitutes the bottom-oxide film 18. The outside of the first semiconductor layer 10 is covered with the bottom-oxide film 18 and thereby the capacity layer 12 is formed (FIG. 7B).

Here, the second oxide film 11b formed on the surface of the first semiconductor layer 10 is thicker than that formed on the side walls of each of the trench 7 because oxide films made of polysilicon grow faster than those made of silicon.

Moreover, when polysilicon is etched, the somewhat damaged first oxide film 11a formed on the side walls of each of the trench 7 is removed and the second oxide film 11b is newly formed thereon. Thus, a stable oxide film formation can be achieved.

Sixth process (FIG. 8): a process for forming a second semiconductor layer to be embedded in the trench and located on the first semiconductor layer.

Polysilicon, constituting a second semiconductor layer 13, is deposited on the entire surface of the substrate. A mask (not shown), forming the desired pattern, is provided on the surface of the substrate followed by dry etching. The polysilicon may be a layer obtained by deposition of polysilicon containing impurities, or a layer obtained by deposition of non-doped polysilicon prior to introduction of impurities. In this way the second semiconductor layer is embedded in each of the trench 7 on the capacity layer 12, constituting the gate electrode 13.

Seventh process (FIGS. 9A, 9B and 10): a process for forming source region of one conduction type on the surface of the channel layer so as to be adjacent to the trench.

A mask of a resist PR (not shown) for exposing region where source region is to be formed is formed. The entire surface of the substrate is then implanted with n-type impurities (e.g., arsenic (As) ions) 15a at an implantation energy of 140 keV and at a dose amount of 5E15 to 6E15 $cm^{-2}$.

Figure 9A:
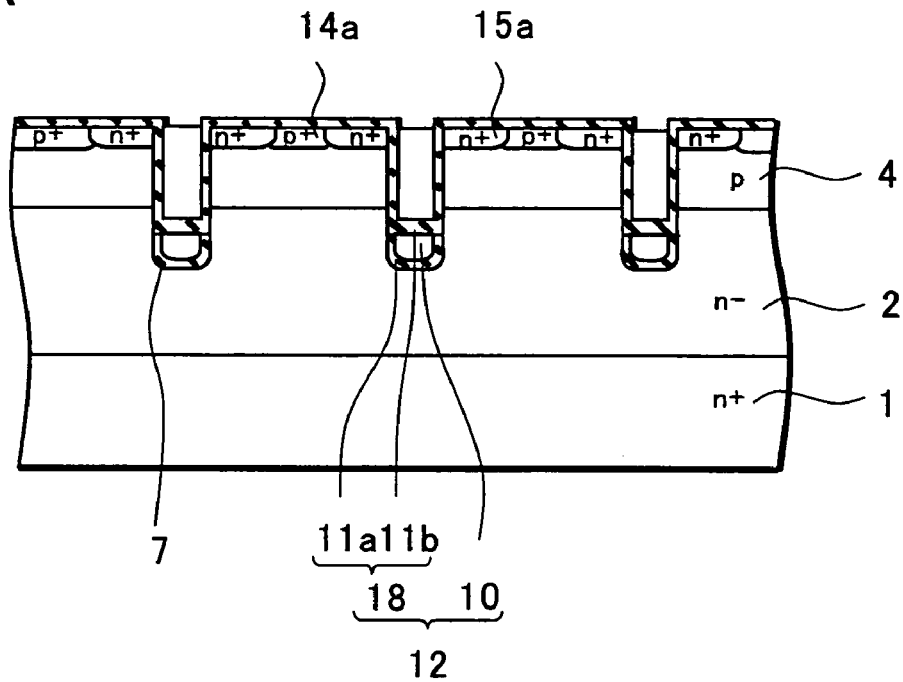
FIG. 9A is a cross-sectional view for explaining the method of manufacturing the insulated gate semiconductor device of the first embodiment.

Subsequently, a mask of a resist PR (not shown) for exposing region where body region is to be formed is formed. The entire surface of the substrate is then implanted with p-type impurities (e.g., boron (B) ions) 14a at an implantation energy of 40 keV and at a dose amount of 2E15 to 5E15 $cm^{-2}$ (FIG. 9A).

Figure 9B:
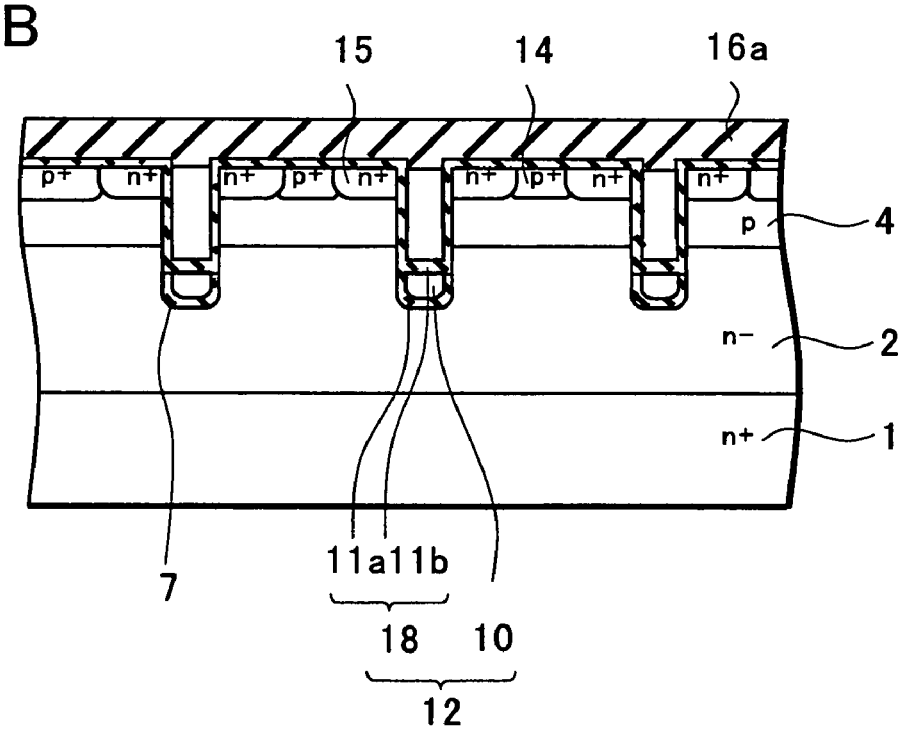
FIG. 9B is a cross-sectional view for explaining the method of manufacturing the insulated gate semiconductor device of the first embodiment.

A boron phosphorus silicate glass (BPSG) layer 16a, constituting an interlayer insulating film, is then deposited on the entire surface of the substrate in a thickness of about 6,000 Å, followed by reflow at about 900° C. This heat treatment diffuses the p-type impurities and the n-type impurities. Thereby, source region 15 is formed so as to be adjacent to the trenches 7 and body region 14 is formed between adjacent the source regions 15 (FIG. 9B). It should be noted that the order in which ion implantation is performed for the source region 15 and the body region 14 is not limited to the order described above. The order may be altered.

Figure 10:
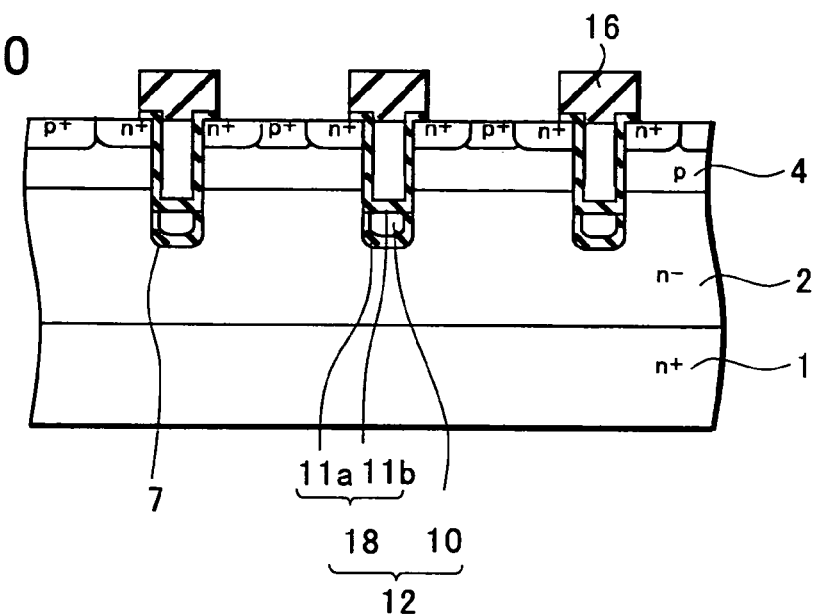
FIG. 10 is a cross-sectional view for explaining the method of manufacturing the insulated gate semiconductor device of the first embodiment.

A mask of a resist PR (not shown) with a predetermined opening pattern is then provided on the BPSG layer 16a as shown in FIG. 10 and etching is performed. Thereafter, reflow is performed at about 900° C. to form interlayer insulating film 16.

Furthermore, aluminum or the like is deposited on the entire surface of the substrate with a sputtering apparatus and patterned in a desired shape. A source electrode 17 that comes in contact with the source region 15 and the body region 14 is formed. Thus, the final structure shown in FIG. 1 is provided. In addition, a drain electrode (not shown) is formed on the backside of the substrate.

The manufacturing method in the second embodiment will be described with reference to FIGS. 11 to 14. Note that, descriptions of processes that are the same in the first embodiment will be omitted.

Figure 11:
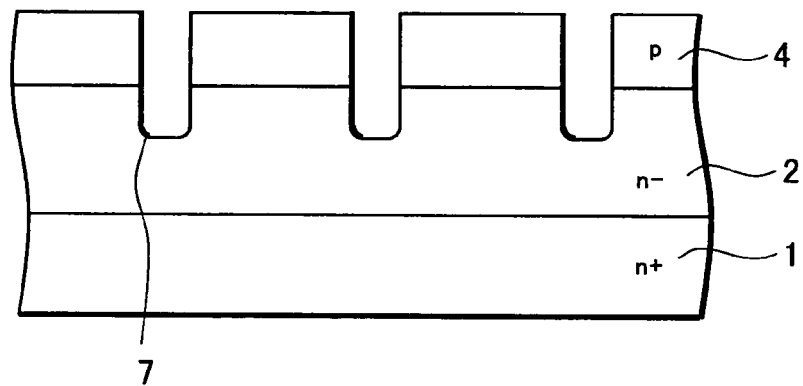
FIG. 11 is a cross-sectional view for explaining the method of manufacturing the insulated gate semiconductor device of the second embodiment.
Figure 12:
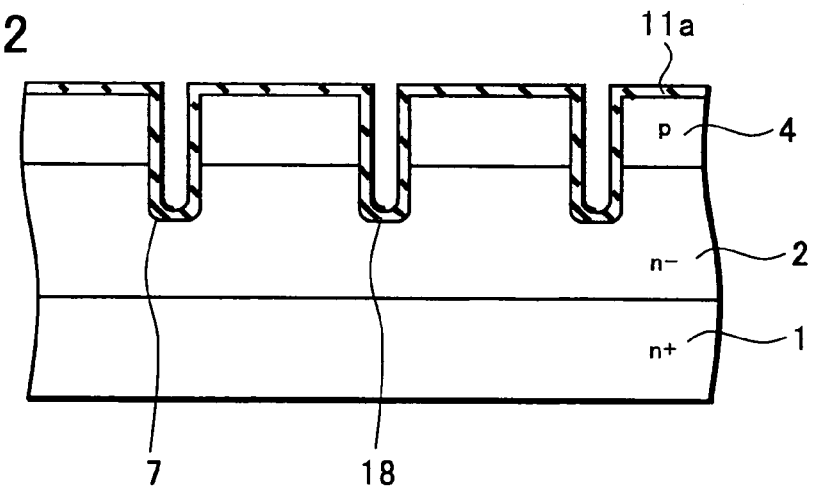
FIG. 12 is a cross-sectional view for explaining the method of manufacturing the insulated gate semiconductor device of the second embodiment.
Figure 13:
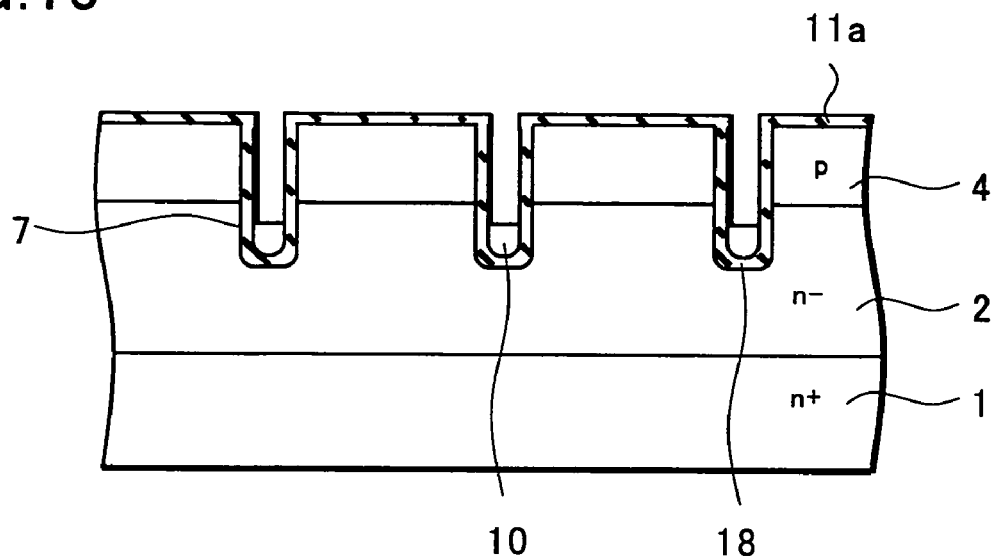
FIG. 13 is a cross-sectional view for explaining the method of manufacturing the insulated gate semiconductor device of the second embodiment.
Figure 14:
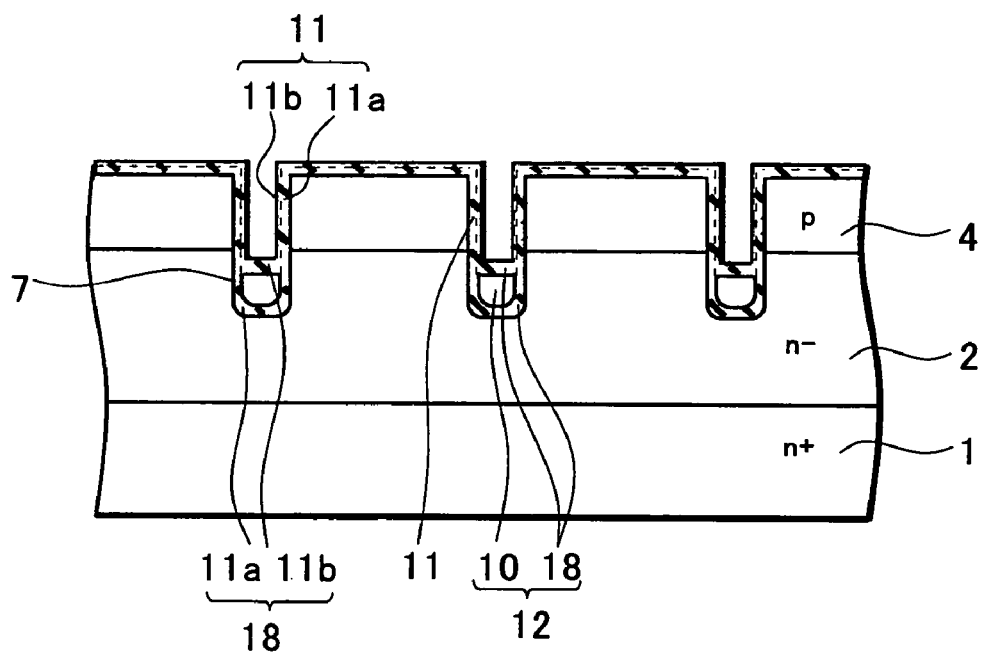
FIG. 14 is a cross-sectional view for explaining the method of manufacturing the insulated gate semiconductor device of the second embodiment.

In accordance with the first and second processes in the first embodiment, the substrate is provided with the drain region, which is obtained by depositing the n⁻ semiconductor layer 2 on the n⁺ silicon semiconductor substrate 1 by epitaxial growth or the like as shown in FIG. 11. A channel layer 4 of an opposite conduction type is provided on the surface of the substrate. Then, trench 7 that penetrate through the channel layer 4 and reach the drain region 2 are formed.

Third process (FIG. 12): a process for forming a first insulating film at least on the inner wall of a trench.

The entire surface of the substrate is thermally oxidized to form a first oxide film 11a on the inner walls of each of the trench 7 in a thickness of, for example, about 300 to 700 Å. The first oxide film 11a formed on the side surface of each of the trench 7 constitutes a part of the gate oxide film, and the first oxide film 11a formed on the bottom of each of the trench 7 constitutes a part of a bottom-oxide film 18.

Forth process (FIG. 13): a process for embedding a first semiconductor layer in the bottom of a trench.

Non-doped polysilicon is deposited on the entire surface of the substrate, filling the trench 7. The entire surface of the substrate is etched back and thereby a first semiconductor layer 10 is formed that is embedded in the bottom of each of the trench 7 provided below the channel layer 4. The first semiconductor layer 10 has a thickness of 1,000 to 3,000 Å. The first semiconductor layer 10 constitutes a capacity layer together with the bottom-oxide film 18.

Fifth process (FIG. 14): a process for forming a second insulating film at least on the inner wall of the trench.

With the first oxide film 11a remained intact, a second oxide film 11b is formed thereon. The second oxide film 11b formed on the side walls of each of the trench 7 constitutes a gate oxide film 11 together with the first oxide film 11a. The second oxide film 11b formed on the surface of the first semiconductor layer 10 constitutes a part of the bottom-oxide film 18.

Thus, the first semiconductor layer 10 is covered with the bottom-oxide film 18 and thereby a capacity layer 12 is formed. In addition, the gate oxide film 11, constituted of the first oxide film 11a and the second oxide film 11b, is formed on the side walls of each of the trench 7 that are adjacent to the channel layer 4.

The second oxide film 11b on the first oxide film 11a grows slow. For this reason, when these oxide films are formed under the same condition, the thickness of the gate oxide film 11 is twice or less that of the first oxide film 11a. Meanwhile, as described above, the second oxide film 11b formed on the surface of the first semiconductor layer 10 is thicker than the second oxide film 11b formed on the side walls of each of the trench 7.

The second embodiment does not require the process for removing the first oxide film 11a. Thus, it is possible to suppress the increase in the number of processes. Moreover, the thickness of the bottom-oxide film 18 can be increased while suppressing the increase in the thickness of the gate oxide film 11 formed on the side walls of each of the trench 7.

Figure 8:
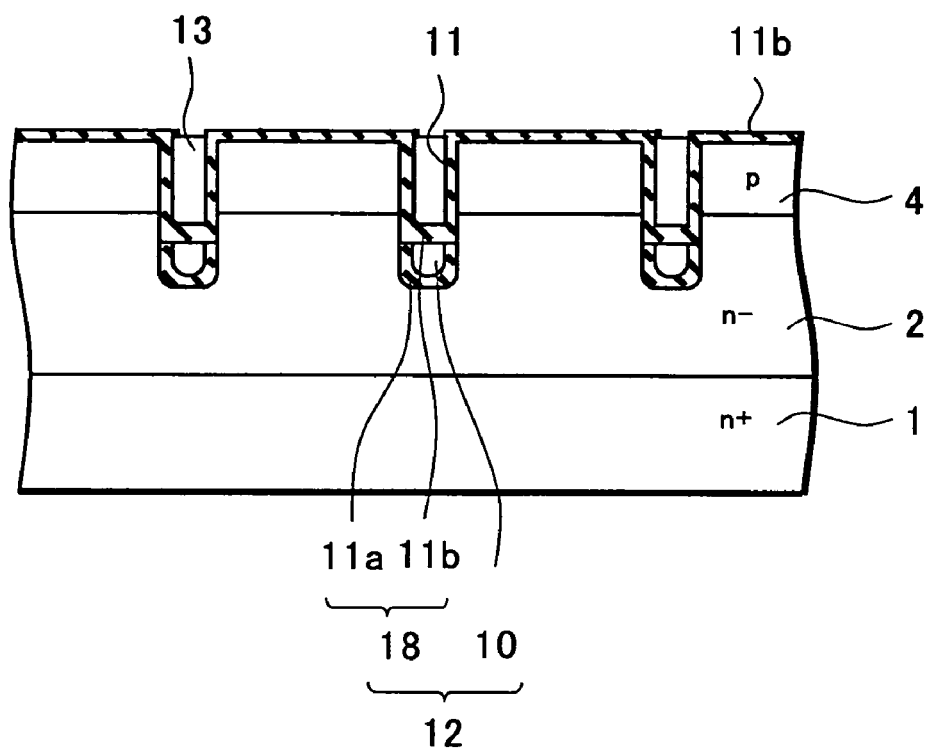
FIG. 8 is a cross-sectional view for explaining the method of manufacturing the insulated gate semiconductor device of the first embodiment.

In accordance with the sixth process of the first embodiment, a second semiconductor layer 13 is then formed that is embedded in the trench 7 and located on the first semiconductor layer 10 (see FIG. 8). Furthermore, in accordance with the seventh process of the first embodiment, n+ type source region 15 of one conduction type is formed on the surface of the channel layer 4 so as to be adjacent to the trenches 7 and a p+ type body region 14 is formed between adjacent the source regions 15. Thus, the interlayer insulating film 16 is then formed (see FIGS. 9A, 9B and 10). In addition, a source electrode 17 is formed and thereby the final structure shown in FIG. 2 is provided.

Figure 15:
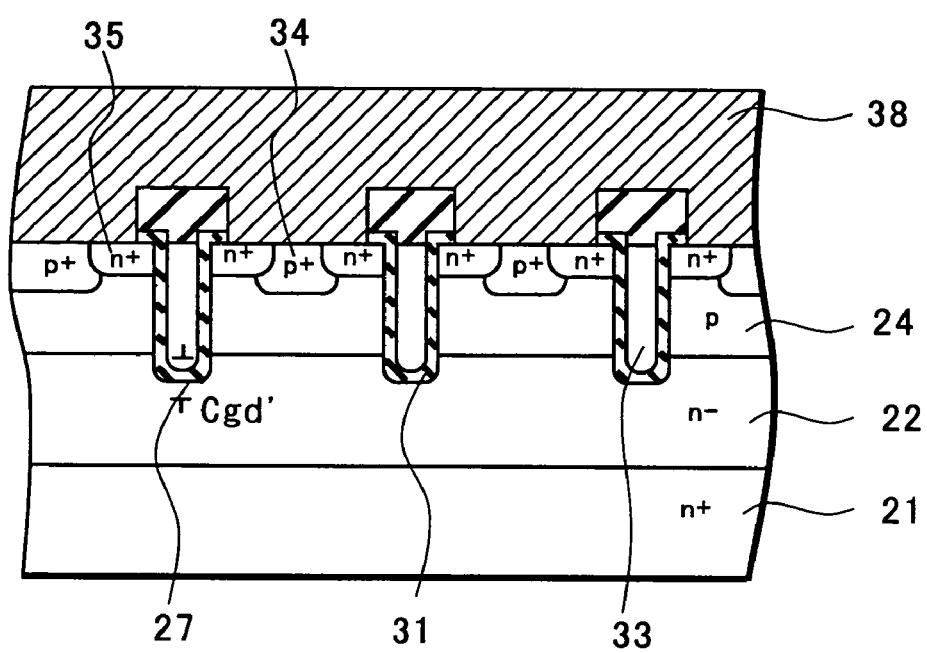
FIG. 15 is a cross-sectional view for explaining a conventional insulated gate semiconductor device and the method of manufacturing the same.
Figure 16A:
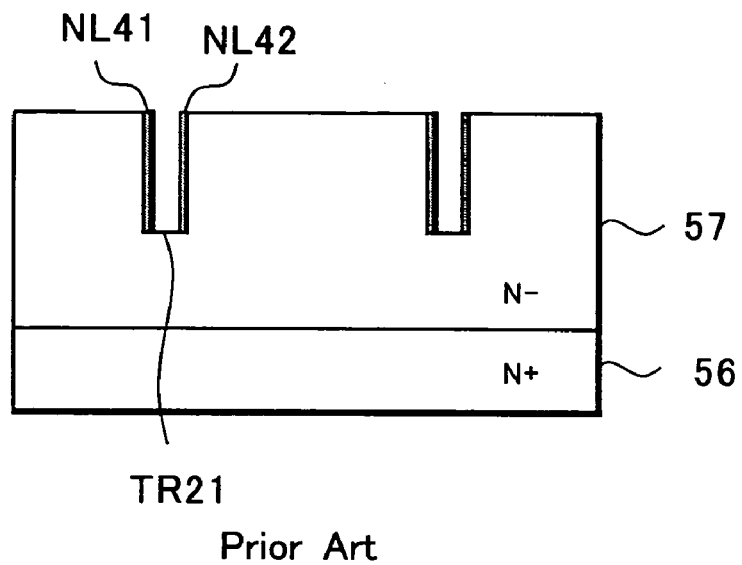
FIG. 16A is a cross-sectional view for explaining the method of manufacturing the conventional insulated gate semiconductor device.
Figure 16B:
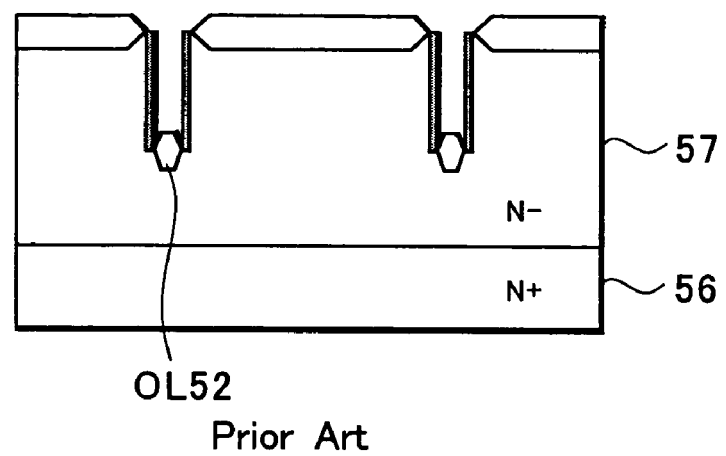
FIG. 16B is a cross-sectional view for explaining the method of manufacturing the conventional insulated gate semiconductor device.
Figure 16C:
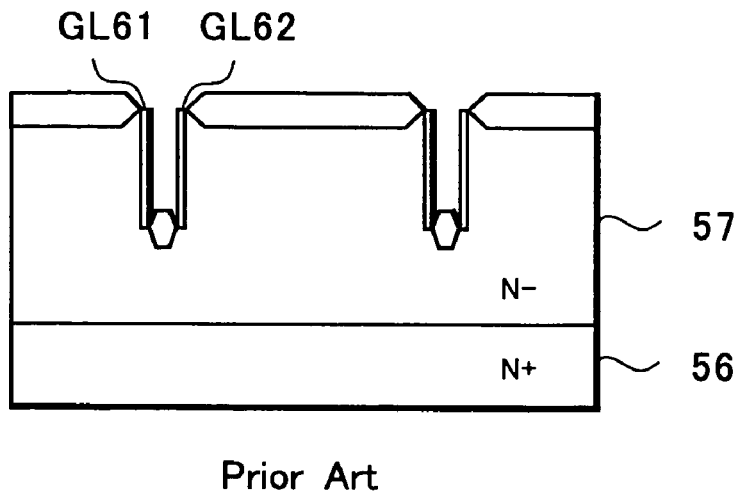
FIG. 16C is a cross-sectional view for explaining the method of manufacturing the conventional insulated gate semiconductor device.
Figure 17:
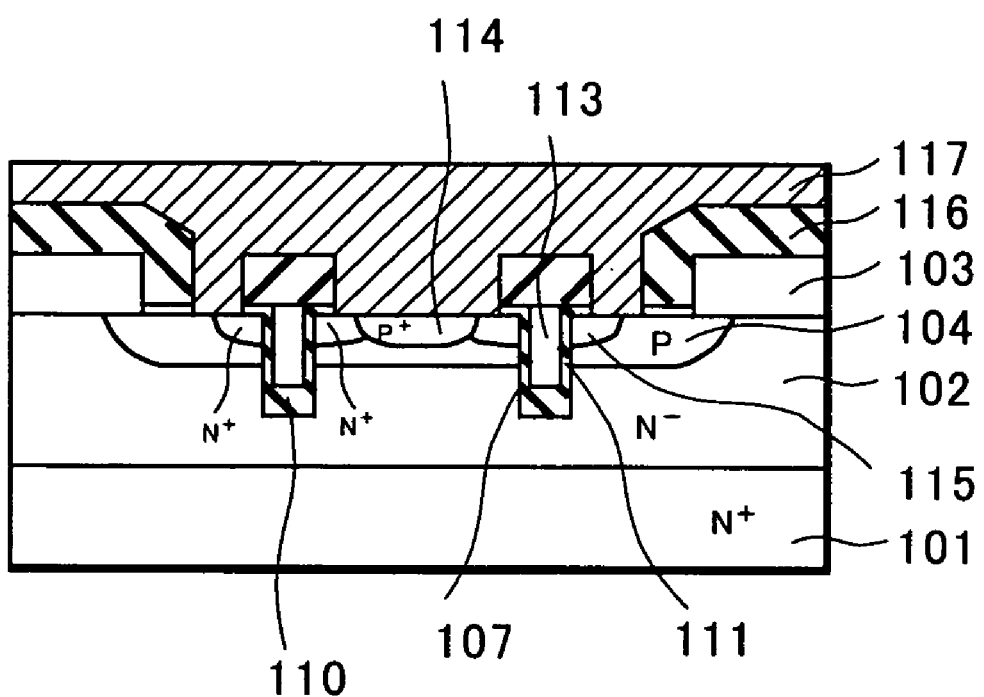
FIG. 17 is a cross-sectional view for explaining the conventional insulated gate semiconductor device and the method of manufacturing the same.

The first and second embodiments have been described for the case where the first semiconductor layer 10 is non-doped polysilicon. However, polysilicon doped with impurities may be used. In this case, only the bottom-oxide film 18 contributes to the reduction in the capacity. However, when the first oxide film 11a of the bottom-oxide film 18 and the gate oxide film shown in FIG. 15 are formed under the same condition, a capacity equivalent to the thickness of the second oxide film 11b can be reduced.

It should be noted that although the present embodiments have been described by way of an n-channel type MOSFET, even a p-channel type MOSFET of an opposite conduction type can similarly implement the present embodiments. Furthermore, the insulated gate semiconductor device is not limited to MOSFETs, and an insulated gate semiconductor device such as IGBTs can similarly implement the present embodiments and thus similar effects can be provided.

First, according to the embodiments of the present invention, the gate-drain capacity $C_{gd}$ can be reduced because a capacity layer is formed on the bottom of each of the trench 7. The capacity layer is one obtained by covering non-doped polysilicon or polysilicon doped with impurities with an insulating film (oxide film). Oxide films have a high etching selectivity to polysilicon. Accordingly, when the oxide film formed on side walls of each of the trench is intended to be removed after the formation of the first semiconductor layer, it can be readily removed by use of, for example, hydrofluoric acid. In other words, a pre-treatment for forming the gate oxide film without damaging the side walls of the trench can be achieved.

Second, by using non-doped polysilicon for the formation of a capacity layer, a capacity layer with an increased thickness can be formed, thereby significantly reducing the gate-drain capacity $C_{gd}'$. To be more specific, when the gate oxide film has a thickness of, for example, about 700 Å, the gate-drain capacity $C_{gd}$ is about 300 pF in a case where a capacity layer is not provided. However, the gate-drain capacity $C_{gd}$ can be reduced to one-third, that is, about 100 pF, by embedding the first semiconductor layer in the bottom of each of the trench in a thickness of about 2,000 Å to constitute, together with bottom-oxide film, the capacity layer.

Third, unlike the case where the CVD method is used to embed an oxide film in trenches for the formation of the capacity layer, seams never be generated because the capacity layer is formed of polysilicon. This leads to elimination of the occurrence of abnormal etching caused by such seams. Thus, stable capacity layer formation can be achieved.

Fourth, manufacturing processes are simplified compared to those where an oxide film selectively grown is used for the formation of a capacity layer. When an oxide film is selectively grown, it requires a process for removing only a nitride film provided on the bottom of each of the trench and a process for removing a nitride film provided on the side walls of each trench. Thus the processes are complicated. However, the present embodiments provide an advantage that the formation of a capacity layer is achieved without removing the oxide film formed on the side walls of each trench. In addition, such processes can be implemented with traditional tools.

What is claimed is:

1. A method of manufacturing an insulated gate semiconductor device, comprising:
    forming on a semiconductor layer of a first general conduction type a channel layer of a second general conduction type;
    forming a trench which penetrates the channel layer and reaches the semiconductor layer so that the trench comprises a channel layer trench portion that is formed in the channel layer and a semiconductor layer trench portion that is formed in the semiconductor layer;
    forming a first insulating film on an inner wall of the trench;
    forming a first semiconductor layer at the semiconductor layer trench portion of the trench;
    forming a second insulating film on the inner wall of the trench so that the second insulating film is formed on the first insulating film disposed at the channel layer trench portion of the trench and on the first semiconductor layer;
    forming in the trench a second semiconductor layer that is disposed on the first semiconductor layer; and
    forming a source region of the first general conduction type in a surface of the channel layer and adjacent the trench.

2. The method of claim 1, wherein the forming of the first semiconductor layer comprises a deposition of a non-doped polysilicon.

3. The method of claim 1, wherein the forming of the first semiconductor layer is performed between the forming of the first insulating film and the forming of the second insulating film.

* * * * *